United States Patent [19]

Hayashi et al.

[11] 4,446,364
[45] May 1, 1984

[54] PHOTOELECTRIC CONVERTER ON A TRANSMISSIVE SUBSTRATE HAVING LIGHT SHIELDING

[75] Inventors: Seiichi Hayashi; Eiichi Hara, both of Yokohama, Japan

[73] Assignee: Hitachi, Ltd., Tokyo, Japan

[21] Appl. No.: 247,262

[22] Filed: Mar. 25, 1981

[30] Foreign Application Priority Data

Mar. 26, 1980 [JP] Japan .................................. 55-37482

[51] Int. Cl.³ .............................................. H01J 40/14
[52] U.S. Cl. .................................. 250/211 R; 250/578
[58] Field of Search ............. 355/11; 250/227, 211 R, 250/211 J, 578; 358/212, 213; 357/31, 32

[56] References Cited

U.S. PATENT DOCUMENTS

| | | |
|---|---|---|
| 3,544,713 | 12/1970 | Case et al. ............................. 178/7.1 |
| 3,622,419 | 11/1971 | London et al. ....................... 156/242 |
| 4,227,078 | 10/1980 | Yamamoto et al. ................. 250/227 |
| 4,232,219 | 11/1980 | Yamamoto et al. ................. 250/227 |
| 4,233,506 | 11/1980 | Yamamoto et al. ................. 250/227 |
| 4,307,372 | 12/1981 | Matsui et al. ......................... 338/15 |

Primary Examiner—David C. Nelms
Assistant Examiner—J. Brophy
Attorney, Agent, or Firm—Antonelli, Terry & Wands

[57] ABSTRACT

In a contact type photoelectric converter device suited for use in facsimile transmitters and character readers, a light transmitting section for transmitting light emitted from a light source is juxtaposed in the vicinity of a row of photoconductive film so that the surface of an original is uniformly illuminated and a major portion of reflected light rays from the original impinges on the photoconductive films thereby improving an efficiency of light utilization.

2 Claims, 7 Drawing Figures

PHOTOELECTRIC CONVERTER ON A TRANSMISSIVE SUBSTRATE HAVING LIGHT SHIELDING

BACKGROUND OF THE INVENTION

1. Field of the Invention

The present invention relates generally to a contact type photoelectric converter device which is applicable to a facsimile transmitter, a character reader and the like. More particularly, the present invention concerns a contact type photoelectric converter device in which a light transmitting section for transmitting therethrough light emitted from a light source is juxtaposed in the vicinity of a row of separated photoconductive film, thereby providing a uniform illumination of an original and a high utilization efficiency of light.

2. Description of the Prior Art

Heretofore, a one-dimensional array of silicon photodiodes has been commonly used for a photoelectric converting section of a facsimile transmitter, a character reader or the like. Since a restriction is imposed on the length of the one-dimensional array, an image of an original to be read is focused on the silicon photodiode array in a reduced scale with the aid of a lens system. This arrangement suffers various drawbacks. For example, relatively large space is occupied by the optical system. Positional adjustment of lens are after required. Degraded resolution as well as insufficiency of light quantity will occur at a peripheral portion of the lens. As an attempt to eliminate these shortcomings, there has been recently proposed a contact type photoelectric converter device which is capable of reading information without using the lens system.

A typical example of the hitherto known contact type photoelectric converter device is shown in a transversal sectional view in FIG. 1 and in a perspective view in FIG. 2. Description will be made below on a structure of this photoelectric converter. On a light transmissive substrate 1 are formed light intercepting or shielding films 2, opaque stripe-like electrodes 3, photoconductive films 4 and a common overlying light transmissive electrode 5, thereby providing a one-dimensional array of photodiodes. A semiconductor element 6 for driving the photoelectric converter device is mounted on the light transmissive substrate 1 and is electrically connected to the strip-like electrodes 3 of the one-dimensional photodiode array. Subsequently, a light transmissive protection film 7 is formed over the one-dimensional photodiode array. A light source 8 is disposed on the substrate side of the thus constructed photoelectric converter device, while a sheet feeding roller 9 is disposed so as to be in contact with the protection film 7 of the one-dimensional photodiode array. An original 10 is fed between the protection film 7 and the feed roller 9. With the structure of such photoelectric converter device, the original 10 is illuminated with those light rays from the light source 8 which have passed through gaps provided between the opaque stripe-like electrodes 3, wherein light components scattered on the surface of the original 10 impinge on the photoconductive films 4, as can be seen from FIG. 3 which shows the photoelectric converter device in a longitudinal sectional view. Accordingly, in order to reduce shadows of the opaque strip-like electrodes 3 projected onto the original for accomplishing a uniform illumination of the original, it is necessary to widen gaps between the adjacent opaque stripe-like electrodes 3, which however means that the pitch 1 of the photoconductive films 4, that is, the resolution of reading is restricted. Further, with the structure of the photoelectric converter, those light components resulting from reflection of incident light rays impinging onto the original in perpendicular thereto will follow the return path toward the light source, whereby light components scattered on the original will impinge on the photoconductive film 4, involving poor utilization of light.

SUMMARY OF THE INVENTION

An object of the invention is to eliminate the disadvantages of the prior art device described above and provide a photoelectric converter device which is capable of illumintating uniformly an original and assures a high resolution as well as an improved light utilization efficiency.

According to the invention, a light transmitting section for transmitting therethrough light from a light source is juxtaposed in the vicinity of a photoelectric converting section including a row of photoconductive films so that a uniform illumination of an original is assured and a major portion of light components reflected from the surface of the original impinge on the photoconductive films.

According to one aspect of the invention, the photoelectric converting section includes a light intercepting film formed on a light transmissive substrate, substantially separated first electrodes and substantially separated photoconductive films formed on the light intercepting film, and a second electrode of light transmissive material and a light transmissive protection film provided over the photoconductive films.

According to another aspect of the invention, the photoelectric converting section includes a first electrode of opaque material formed on a light transmissive substrate, substantially separated photoconductive films formed on the first electrode, and a second electrode of light transmissive material and a light transmissive protection film formed on the photoconductive films.

DESCRIPTION OF THE PREFERRED EMBODIMENTS

Figure 1:
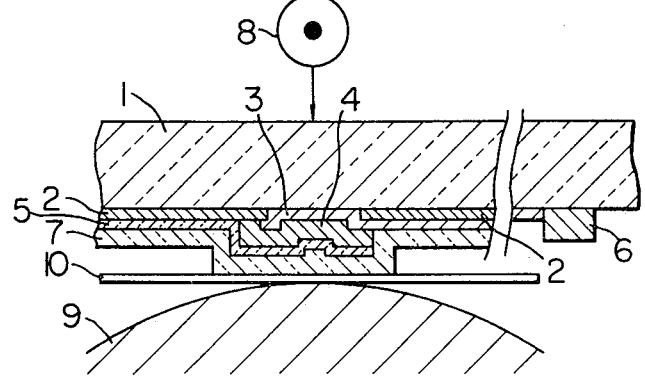
FIG. 1 shows in a traversal sectional view a hitherto known contact type photoelectric converter device.
Figure 2:
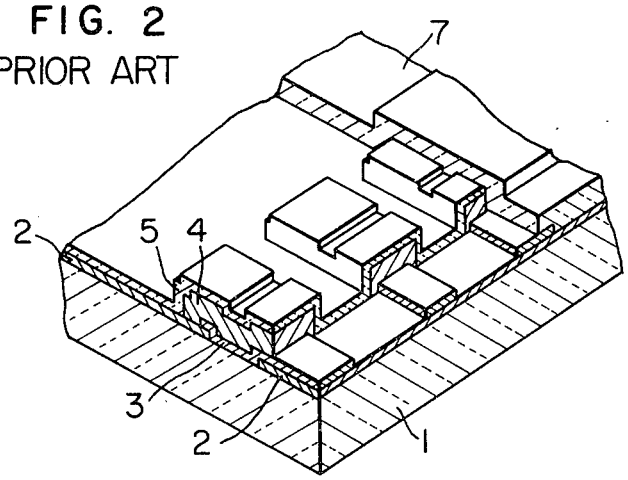
FIG. 2 shows the same in a perspective view.
Figure 3:
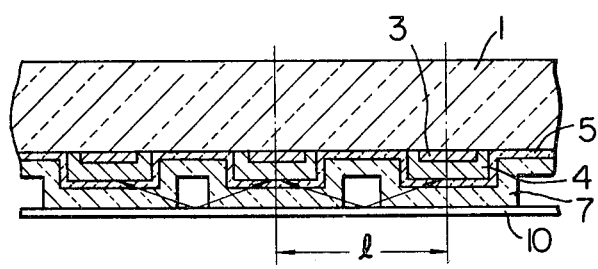
FIG. 3 shows the same in a longitudinal sectional view.
Figure 4:
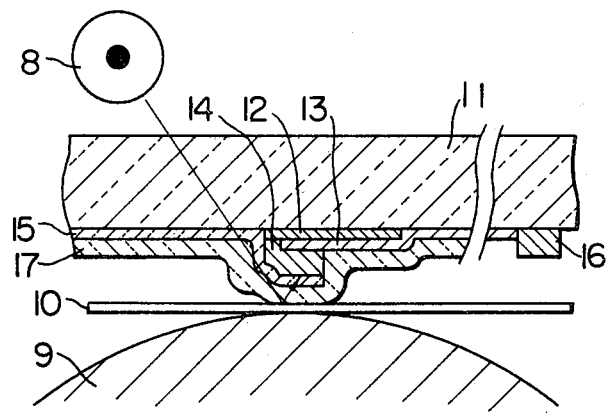
FIG. 4 shows in a transversal sectional view a contact type photoelectric converter device according to an embodiment of the invention.
Figure 5:
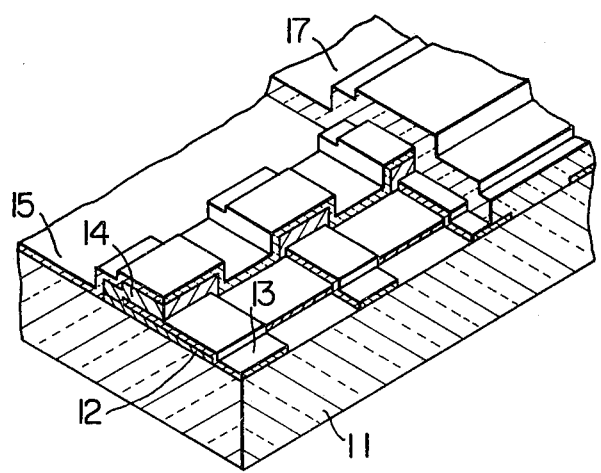
FIG. 5 shows the same in a perspective view.

In the following, a first embodiment of the present invention will be described by referring to FIGS. 4 and 5 which show a fundamental structure of the photoelectric converter device according to the invention in a transversal sectional view and a perspective view, respectively.

The photoelectric converter comprises a light transmissive substrate 11 formed of glass, for example, and having a thickness of about 1 to 5 mm. A light intercepting or shielding film 12 which may be constituted by electrically insulative and opaque film such as SiC-spattered film or Ta$_2$O$_5$-spattered film for example, and has a film thickness of the order of 0.2 μm to 2.0 μm is provided on the light transmissive substrate 11. On the light intercepting film 12 are provided stripe-like electrodes 13 each made of an evaporated film of gold or aluminium and having a film thickness in the range of 0.5 μm to 2.0 μm. Photoconductive films 14 each of which may be constituted by an evaporated film 1 μm to 3 μm thick of an amorphous semiconductor material of Se-As-Te series or an evaporated film of amorphous silicon, for example, are formed over the stripe-like electrodes 13 and the light intercepting film 12 in such a geometrical relation that the edge of the light intercepting film 12 is substantially aligned with the edge of the photoconductive film 14. A common electrode 15 which may be formed of tin oxide or indium oxide, for example, and has a thickness of about 0.1 μm to 1.0 μm is formed over the photoconductive film 14. Thus, there is formed a one-dimensional array of photodiodes. Subsequently, a semiconductor element 16 in which switching transistors and a shift register for driving the converter device are integrally implemented is mounted on the light transmissive substrate 11. Next, the semiconductor element 16 is electrically connected to the stripe-like electrodes 13 of the one-dimensional array of photodiodes through appropriate wiring. Finally, a light transmissive protection film 17 of a laminated structure having two layers formed, for example, of a SiO$_2$-spattered film of about 2 μm to 5 μm in thickness and a Ta$_2$O$_5$-spattered film of about 5 μm to 10 μm in thickness, respectively, is formed over the one-dimensional array of photodiodes.

A light source 8 which may be constituted by an elongated tungsten lamp, a fluorescent lamp or a linear array of light emitting diodes is disposed on the side of the light transmissive substrate 11 of the thus fabricated photoelectric converter device. A sheet feed roller 9 is disposed so as to be in contact with the protection film 17 of the one-dimensional array of photodiodes. An original 10 is transported between the protection film 17 and the feed roller 9. With the structure of the photoelectric converter device described above, light emitted from the light source 8 passes through the light transmissive substrate 11, the light transmissive electrode 15 and the protection film 17 to reach the surface of the original 10, whereby light components reflected from the original 10 impinge on the photoconductive films 14 through the light transmissive electrode 15, as is shown in FIG. 4. Since a light transmitting section is juxtaposed with the row of the photoconductive films, a uniform illumination of the original can be assured independently from the pitch of the photoconductive films 14. This means that the pitch of the photoconductive films in row can be selected smaller. In other words, a photoelectric converter device exhibiting a high resolution can be easily fabricated. Further, the position of the light source 8 is selected such that the reflected light components impinge on the photoconductive films, the photoelectric converter device can enjoy a high light utilization efficiency as compared with the case where the scattered light components impinge on the photoconductive films.

Figure 6:
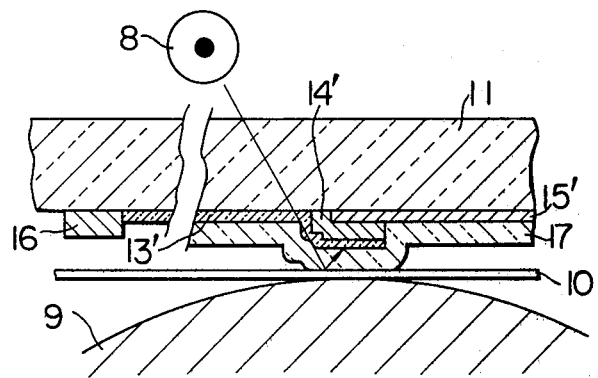
FIG. 6 shows in a transversal sectional view a second embodiment of the invention.
Figure 7:
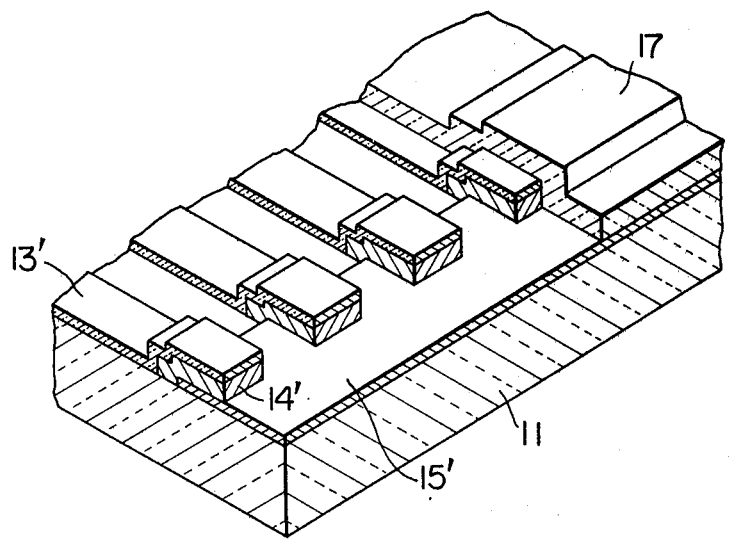
FIG. 7 shows the same in a perspective view.

Next, a second embodiment of the invention will be described by referring to FIGS. 6 and 7 which shows a basic structure of the inventive photoelectric converter device in a sectional view and a perspective view, respectively. An opaque common electrode 15' formed, for example, of an evaporated film of gold or aluminium and having a film thickness of about 0.5 μm to 2 μm is provided on a light transmissive substrate 11. Provided on the common electrode 15' are discrete photoconductive films 14' each of which may be formed, for example, of an evaporated film of an amorphous semiconductor material of Se-As-Te series and an evaporated film of amorphous silicon and has a thickness of about 1 μm to 3 μm and stripe-like electrodes 13' each formed of a transparent and electrically conductive film of tin oxide, indium oxide or the like and having a film thickness of about 0.1 μm to 1 μm. Thus, a one-dimensional array of photodiodes.

Remaining portions of the photoelectric converter device now being described are realized in the same manner as in the case of the first embodiment. The structure or construction of the photoelectric converter device according to the second embodiment is simplified in respect that the light intercepting or shielding film required for the first embodiment is spared. However, since light impinges directly on the edge portions of the photoconductive films 14', the electric signal available from the output of the photoelectric converter device according to the second embodiment is slightly degraded in respect of signal to noise ratio. It is conceivable that a light intercepting film is provided under the photoconductive films 14' and the common electrode 15' with a view to improving the signal to noise ratio.

The invention has now provided the photoelectric converter device which exhibits a high resolution, assures a uniform illumination of an original and enjoys a high efficiency of light utilization.

What is claimed is:
1. A photoelectric converter device comprising:
a light transmissive substrate;
an elongated stripe-like light intercepting film formed on one surface of said light transmissive substrate;
a light source disposed on an opposite side of said light transmissive substrate relative to said light intercepting film;
a group of separated first electrodes, each of said first electrodes extending across the light intercepting film in a manner covering more than half of said light intercepting film in the width direction thereof and continuing from a longitudinally extending edge of said light intercepting film in a direction away from said light intercepting film;
separated photoconductive films of a semiconductor material provided corresponding in number to said first electrodes, each of said photoconductive films being formed on a peripheral portion of a respective one of the first electrodes which covers said light intercepting film;
a second electrode of a light transmissive material formed at the other widthwise side of said light intercepting film in a manner so as to commonly cover said photoconductive films and so as to extend outwardly from said other side of said light intercepting film; and
a light transmissive protection film, of a type suitable for contacting an information carrying surface in use, formed on said first and second electrodes so as to cover them;
whereby, in use, light from said light source will reach an information carrying surface disposed in contact with said light transmissive substrate through said light transmissive substrate, said second electrode and said light transmissive protec- tion film, and light reflected from said information carrying surface will reach said photoconductive films through said light transmissive protection film and said second electrode.

2. A photoelectric converter device comprising:

a light transmissive substrate;

an elongated strip-like opaque common electrode formed on one surface of said light transmissive substrate;

a light source disposed on an opposite side of said light transmissive substrate relative to said opaque common electrode;

a plurality of separated photoconductive films, each of said photoconductive films extending across the opaque common electrode, in the width direction, to a longitudinally extending edge thereof in a manner such that more than half of each photoconductive film lies covering said opaque common electrode;

a group of light transmissive electrodes corresponding in number to said photoconductive films, each of said light transmissive electrodes extending in a manner covering a respective one of the photoconductive films and continuing therebeyond in a direction away from said opaque common electrode; and a light transmissive protection film, of a type adapted to contact an information carrying surface in use, formed on said opaque common electrode and said light transmissive electrodes;

whereby, in use, light from said light source will reach an information carrying surface disposed in contact with said light transmissive protective film through said light transmissive substrate, said light transmissive electrodes and said light transmissive protection film, and light reflected from said information carrying surface will reach said photoconductive films through said light transmissive protection film and said light transmissive electrodes.

* * * * *